(12) United States Patent
Maier et al.

(10) Patent No.: US 6,504,358 B1
(45) Date of Patent: Jan. 7, 2003

(54) METHOD FOR DETECTING THE OPERATING TEMPERATURE OF A MOTOR

(75) Inventors: Reinhard Maier, Herzogenaurach (DE); Paul Fröhlich, Sulzbach-Rosenberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/537,884

(22) Filed: Mar. 29, 2000

Related U.S. Application Data

(63) Continuation of application No. PCT/DE98/02800, filed on Sep. 21, 1998.

(30) Foreign Application Priority Data

Sep. 29, 1997 (DE) .......................................... 197 43 046

(51) Int. Cl.⁷ ............................................... G01R 27/00
(52) U.S. Cl. ..................... 324/158.1; 324/441; 324/772
(58) Field of Search .................. 324/441, 431, 324/224, 760, 685, 670, 721, 713, 772; 318/446, 471

(56) References Cited

U.S. PATENT DOCUMENTS

| | | | |
|---|---|---|---|
| 3,676,774 A | * 7/1972 | Stokes et al. | 324/706 |
| 4,083,001 A | * 4/1978 | Paice | 324/772 |
| 4,897,584 A | * 1/1990 | Grützmacher | 318/471 |
| 4,914,386 A | 4/1990 | Zocholl | |
| 5,729,104 A | * 3/1998 | Kamishima et al. | 318/446 |

FOREIGN PATENT DOCUMENTS

| | | |
|---|---|---|
| DE | 1 613 897 | 11/1970 |
| DE | 25 49 850 B2 | 11/1979 |
| DE | 31 11 818 A1 | 4/1982 |
| DE | 259 461 A1 | 8/1988 |
| DE | 37 06 659 A1 | 9/1988 |
| DE | 44 31 045 A1 | 3/1996 |
| EP | 0 332 568 B1 | 1/1993 |
| EP | 0 414 052 B1 | 6/1993 |
| GB | 2 075 291 A | 11/1981 |

OTHER PUBLICATIONS

Japanese Patent Abstract No. 08159890 (Atsushi), dated Jun. 21, 1996.

* cited by examiner

*Primary Examiner*—N. Le
*Assistant Examiner*—Vincent Q. Nguyen
(74) *Attorney, Agent, or Firm*—Laurence A. Greenberg; Werner H. Stemer; Gregory L. Mayback

(57) ABSTRACT

In order to detect a motor temperature during operation of a motor without using any sensors, the motor temperature is determined when the motor is switched on by measuring a current and a voltage at the time when the motor is switched on. The motor temperature can be determined by relationships by determining the real element of the motor impedance from the current and voltage signals, and comparing the values when the motor is stationary and values which have been obtained at a known temperature. The determination can be carried out in analog or digital form, with a computer being used in the latter case.

8 Claims, 1 Drawing Sheet

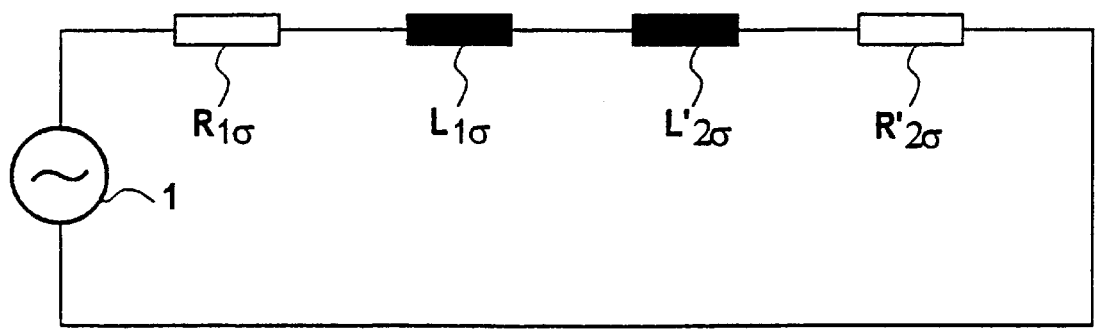

METHOD FOR DETECTING THE OPERATING TEMPERATURE OF A MOTOR

CROSS-REFERENCE TO RELATED APPLICATION

This is a continuation of copending International Application PCT/DE98/02800, filed Sep. 21, 1998, which designated the United States.

BACKGROUND OF THE INVENTION

Field of the Invention

The invention relates to methods for detecting the operating temperature of motors, in which a motor temperature and associated electrical parameters are determined for calibration in a learning phase at defined times and the electrical parameters are then monitored in a motor operating phase in order to derive the motor temperature.

Overload relays are normally used for protection of motors. Such overload relays are equipped either with bimetallic strips or with analog or digital evaluation circuits in order to determine an overload. This admittedly satisfies the requirements resulting from the relevant regulations; however, the motor is not sufficiently accurately protected. Further parameters, in particular the operating temperature of the motor for optimization, must also be detected, whose determination is comparatively complex using normal methods. Various devices and circuits for detecting the operating temperature of motors are known from the prior art. In detail, the published and examined patent application DE 16 13 879 B1 describes a measurement configuration for determining the winding temperature in electrical appliances, in which a transformer is used to separate the direct current and alternating current from a resistance change resulting from superimposition of a direct current in appliances which are operated with alternating current. In an iron circuit of the transformer a Hall generator is located, and the alternating flux in the transformer is compensated for by a further transformer, which is located in the same circuit. Furthermore, a thermal overload protection device for an electrical machine is known from the published and examined patent application DE 25 49 850 B2, in which an overload relay associated with the machine is able to use the measured stator current to provide an accurate, thermal map of the motor in normal operation. Furthermore, an operating procedure and an associated control circuit to monitor the starting process for electrical high-voltage motors with asynchronous starting are known from European patent EP 0 332 568 B1, in which the rotor rotation speed and associated power are detected, and in which heating values, which represent the relative heating state of the motor when it is operated at different rotation speeds and load states, are stored. Finally, a configuration of this type is known from the European patent EP 0 414 052 B1, in which one or more measurement AC voltage sources are connected in series in each of one or more phases of the mains that supplies the electrical machine, so that one or more known voltage components, which are not at the mains frequency, are added to the mains voltage. A current at these frequencies is then passed through the winding of the machine and—measured using current transformers—is a measure of the conductance of the winding, and thus a measure of its temperature.

In addition to the above prior art, a method and an associated apparatus for determining the temperature of an asynchronous motor are known from the published British patent application GB 20 75 291 A. There a value which represents the respective motor resistance is derived on the basis of the amplitude of the voltage applied to the motor, the amplitude of the motor current, the phase angle between the voltage and the current and the run-on derived from harmonics of the current flowing in the motor supply lines. In this case, the motor temperature and associated electrical parameters are detected as calibration variables in a learning phase at defined times when the motor is running. The aim is to use empirical relationships to convert the so-called "equivalent resistance value" into a corresponding temperature value, and this can be used to monitor the motor for unacceptably excessive heating. Furthermore, a thermal overheating system for induction motors is known from U.S. Pat. No. 4,914,386, in which, in a corresponding manner, measurements of electrical variables are intended to allow subsequent calculations to be carried out to determine the energy produced, which is likewise intended to be a measure of the temperature during operation of the motor.

SUMMARY OF THE INVENTION

It is accordingly an object of the invention to provide a method for detecting the operating temperature of motors which overcomes the hereinafore-mentioned disadvantages of the heretofore-known method of this general type and to specify simpler methods for motor temperature detection without sensors, by which, in particular, it is also possible to determine motor overloads in a simple manner.

The object is achieved according to the invention in that, in the operating phase, the motor temperature is determined when the motor is switched on, for which purpose the current and voltage are measured at the time when the motor is switched on. The motor temperature is determined by determining the real element of the motor impedance and a comparison of the measured values for the stationary motor and those measured values which have been obtained at a known temperature. In which case, in a first alternative, the real element of the voltage which can be detected by the measurement of the electrical characteristic of the motor and, in a second alternative, the real element is determined from the peak values of the voltage, current and associated phase shift.

In the first alternative, the power signal can be determined first, by analog multiplication of current and voltage signals. Low-pass filtering makes it possible to determine the DC element of the power signal from this in a simple manner, and this is required to determine the temperature.

On the other hand, in a second alternative for determining the real element of the motor impedance, only the current and voltage amplitudes as well as their phase shift are used. If the amplitude of the voltage is constant, there is advantageously no need to measure it.

In addition to analog multiplication of the measurement variables, it is also just as possible to determine the variables digitally. An appropriate computer can be provided for this purpose The invention allows the problems described initially to be solved in a very simple manner, since the motor temperature can be determined at switch on without any sensors, that is to say without any cables or the like within the motor. Since the relationship between the resistance, that is to say the real element of the impedance for the materials used in the motor, for example aluminum and copper, and the temperature is known, a calibration value can be determined by a single measurement on the stationary motor at a higher temperature. The motor temperature can then be determined by comparison with these values from the real element of the motor impedance when the motor is running.

The invention makes it possible, when determining overload situations, to correct the individual measurements obtained from the known method, to which, for example, the behavior of a bimetallic strip is modeled in a processor, by the true motor temperature when the motor starts to run. A correction may also be applied repeatedly as the motor continues to run.

Considerable simplifications result from the fact that the temperature measurement is now carried out when the motor rotor is still stationary. In this case, the equivalent circuit of the motor is very simple, since the secondary circuit is short-circuited, and the main inductance and the iron losses are thus no longer also measured.

Other features which are considered as characteristic for the invention are set forth in the appended claims.

Although the invention is illustrated and described herein as embodied in a method for detecting the operating temperature of motors, it is nevertheless not intended to be limited to the details described, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE shows an equivalent circuit of a motor when the rotor is stationary.

DESCRIPTION OF THE PREFERRED EMBODIMENTS

Referring now to the single FIGURE of the drawing in detail, there is shown a voltage source 1 for an AC voltage U. An electric motor containing a stator and rotor is thus operated, with the equivalent circuit being simple at the time when the motor is switched on. In detail, it contains series-connected resistors, that is to say $R = R_{1\sigma} + R'_{2\sigma}$ and inductances, that is to say $L = L1_{\sigma 4} + L'_{2\sigma}$. In this case, $R_{1\sigma}$ and $L_{1\sigma}$ are, respectively, the resistance and inductance of the stator, and $R'_{2\sigma}$ and $L'_{2\sigma}$ are the resistance and inductance, respectively of the rotor, transposed to the stator. The equivalent circuit is thus described sufficiently for the switched-on motor, while the transformer coupling is added to this, for motor operation.

Since the resistances can be described by a linear temperature response, calibration at a single temperature that is higher than room temperature is sufficient. If the current and voltage are measured at the time of switch on, it is possible to determine the motor temperature from the determination of the real element of the motor impedance by a comparison of a "cold value" with a "hot value". Only the real element $R = R_{1\sigma + R'2\sigma}$ need then be determined.

The real element R is determined in a simple manner in that the current signal and voltage signal that are present are multiplied by one another. This may be done, for example, by analog devices. This results in a power signal which contains on the one hand a DC element, and on the other hand an AC element, with the AC element being at twice the mains frequency. Low-pass filtering of the complex power signal results in the DC signal P. Since $L_{1\sigma} + L'_{2\sigma}$ is known for the motor at the time of switch on, the real element R defined above can be determined from the DC signal P. This results in $$R = \frac{\hat{U}^2}{2P}\left(1 + \sqrt{1 - \frac{4\omega^2 L^2 P^2}{\hat{U}^4}}\right)$$

where $\hat{U}$=peak value of the voltage and: $\omega=2\pi f$.

In a modified method, the current flowing and the associated voltage are measured, and the phase shift is determined. If the amplitude of the AC voltage supplied by the voltage source is constant, there is no need to measure it. In this case, R becomes:

$$R = \frac{\hat{U}}{\hat{I}}\cos\varphi$$

where $\hat{U}$, $\hat{I}$ are both peak values and $\psi$ is the phase.

Instead of analog multiplications, it is also possible to use digital computation methods for the determination, which has been dealt with in detail above, of the real element of the motor impedance. A normal computer is suitable for this purpose.

We claim:

1. A method for detecting a temperature of a starting motor with a still stationary rotor having a complex impedance with a real and an imaginary element, the method which comprises:

determining values of a current and a voltage of the starting motor with the still stationary rotor; and determining a motor temperature of the starting motor with the still stationary rotor by determining a value of a real element R of a motor impedance of the starting motor with the still stationary rotor and comparing with a value of a real element R of a motor impedance which have been obtained at a known temperature, in which the real element R of the motor impedance is determined by the relationships $$R = \frac{\hat{U}^2}{2P}\left(1 + \sqrt{1 - \frac{4\omega^2 L^2 P^2}{\hat{U}^4}}\right)$$

and $$L = L_{1\sigma} + L'_{2\sigma}$$

from the measured values and known characteristic variables for the motor, where $\hat{U}$=peak value of the voltage P=DC component of power L=inductance in a motor equivalent circuit $L_{1\sigma}$=inductance of a stator $L'_{2\sigma}$=inductance of a rotor, transposed to the stator $\omega=2\pi f$.

2. The method according to claim 1, which comprises determining the real element R of the motor impedance by digital calculation.

3. The method according to claim 1, which further comprises:

determining a power signal having a DC element and an AC element by analog multiplication of the current and the voltage; and extracting the DC element from the power signal.

4. The method according to claim 3, wherein the power signal AC element has a frequency of twice a mains frequency; and further comprising eliminating the AC element from the power signal.

5. The method according to claim 4, which comprises obtaining the DC element from the power signal by low-pass filtering.

6. A method for detecting a temperature of a starting motor with a still stationary rotor having a complex impedance with a real and an imaginary element, the method which comprises:

determining values of a current and a voltage of the starting motor with the still stationary rotor; and determining a motor temperature of the starting motor with the still stationary rotor by determining a value of a real element R of a motor impedance of the starting motor with the still stationary rotor and comparing with a value of a real element R of a motor impedance which have been obtained at a known temperature, where the real element R of the motor impedance is determined from the relationship $$R = \frac{\hat{U}}{\hat{I}}\cos\varphi$$

from electrical variables, where
 $\hat{U}$=peak values of the voltage:
 $\hat{I}$=peak value of the current, and
 $\psi$=phase shift between the voltage and the current.

7. The method according to claim 6, wherein the voltage has a constant amplitude.

8. The method according to claim 6, which comprises determining the real element R of the motor impedance by digital calculation.

* * * * *